United States Patent
Basol et al.

(10) Patent No.: US 7,211,174 B2
(45) Date of Patent: *May 1, 2007

(54) METHOD AND SYSTEM TO PROVIDE ELECTRICAL CONTACTS FOR ELECTROTREATING PROCESSES

(75) Inventors: Bulent M Basol, Manhattan Beach, CA (US); Homayoun Talieh, San Jose, CA (US); Boguslaw A. Nagorski, San Jose, CA (US); Cyprian E. Uzoh, San Jose, CA (US); Jeffrey A. Bogart, Los Gatos, CA (US)

(73) Assignee: Novellus Systems, Inc., San Jose, CA (US)

( * ) Notice: Subject to any disclaimer, the term of this patent is extended or adjusted under 35 U.S.C. 154(b) by 658 days.

This patent is subject to a terminal disclaimer.

(21) Appl. No.: 10/283,025

(22) Filed: Oct. 28, 2002

(65) Prior Publication Data

US 2003/0089598 A1 May 15, 2003

Related U.S. Application Data

(63) Continuation-in-part of application No. 09/760,757, filed on Jan. 17, 2001, now Pat. No. 6,610,190.

(60) Provisional application No. 60/348,758, filed on Oct. 26, 2001.

(51) Int. Cl.
*C25D 17/00* (2006.01)

(52) U.S. Cl. ............... 204/198; 204/199; 204/200; 204/212; 204/215; 204/216; 204/224 R; 204/224 M; 204/286.1; 204/297.01

(58) Field of Classification Search .......... 204/198, 204/199, 200, 212, 215, 216, 224 R, 224 M, 204/286.1, 297.01
See application file for complete search history.

(56) References Cited

U.S. PATENT DOCUMENTS

| | | | |
|---|---|---|---|
| 6,156,167 A | 12/2000 | Patton et al. | 204/270 |
| 6,482,307 B2* | 11/2002 | Ashjaee et al. | 205/103 |
| 6,497,800 B1* | 12/2002 | Talieh et al. | 204/224 R |
| 6,610,190 B2* | 8/2003 | Basol et al. | 205/133 |
| 6,852,208 B2* | 2/2005 | Ashjaee et al. | 205/137 |
| 2001/0000396 A1 | 4/2001 | Dordi et al. | 204/212 |
| 2001/0035354 A1 | 11/2001 | Ashjaee et al. | 205/103 |
| 2002/0053516 A1 | 5/2002 | Basol et al. | 205/118 |

FOREIGN PATENT DOCUMENTS

WO     WO 01/71066     9/2001

* cited by examiner

Primary Examiner—Arun S. Phasge
(74) Attorney, Agent, or Firm—Knobbe Martens Olson & Bear LLP

(57) ABSTRACT

Systems and methods to provide electrical contacts to a workpiece to facilitate electrotreating processes, including electroplating and electroetching processes are presented.

16 Claims, 12 Drawing Sheets

METHOD AND SYSTEM TO PROVIDE ELECTRICAL CONTACTS FOR ELECTROTREATING PROCESSES

CROSS REFERENCE TO RELATED APPLICATIONS

This application claims priority to U.S. Provisional Application Ser. No. 60/348,758, filed Oct. 26, 2001, entitled "Method and System to Provide Electrical Contacts For Electrotreating Processes" and is a continuation-in-part of U.S. application Ser. No. 09/760,757 entitled "Method and Apparatus for Electrodeposition of Uniform Film with Minimal Edge Exclusion on Substrate," filed on Jan. 17, 2001, now U.S. Pat. No. 6,610,190 the contents of which are expressly incorporated by reference herein.

BACKGROUND

1. Field of the Invention

The present invention generally relates to semiconductor integrated circuit technology and, more particularly, to electrotreating techniques such as electroplating and electroetching that are applied to the entire face of a workpiece.

2. Background of the Related Art

Conventional semiconductor devices such as integrated circuits generally include a semiconductor substrate, usually a silicon substrate, and a plurality of sequentially formed dielectric interlayers such as silicon dioxide, and conductive paths or interconnects made of conductive materials. Copper and copper alloys have recently received considerable attention as interconnect materials because of their superior electromigration and low resistivity characteristics. The interconnects are usually formed by filling a conductor such as copper in features or cavities etched into the dielectric interlayers by a metallization process. The preferred method of copper metallization process is electroplating. In an integrated circuit, multiple levels of interconnect networks laterally extend with respect to the substrate surface. Interconnects formed in sequential layers can be electrically connected using features such as vias or contacts.

In a typical interconnect fabrication process, first an insulating layer is formed on the semiconductor substrate. Patterning and etching processes are performed to form features such as trenches, pads and vias etc. in the insulating layer. Then, copper is electroplated to fill all the features. In such electroplating processes the wafer is placed on a wafer carrier and a cathodic (−) voltage with respect to an electrode is applied to the wafer surface while the electrolyte wets both the wafer surface and the electrode. The voltage is typically applied using contacts surrounding the circumference of the wafer. The contacts are usually electrically sealed and isolated from the electrolyte by a clamp covering the circumference of the wafer surface. The clamp inhibits copper deposition on the contacts but it also inhibit copper deposition along the circumference of the wafer and causes loss of important space on the wafer. In the semiconductor industry, this unused or wasted wafer area is called edge exclusion. In the semiconductor integrated circuit industry, there is always a drive towards reducing edge exclusion on the wafers.

Once the plating is over, a chemical mechanical polishing (CMP) step, an electroetching (or electropolishing) or etching step, or a combination of these steps are conducted to remove the excess copper layer or copper overburden and other conductive layers that are above the top surface of the substrate. This process electrically isolates the copper deposited into various features on the wafer and thus forms the interconnect structure. The interconnect process is then repeated as many times as the number of interconnect layers desired.

In the electroetching process both the material to be removed and a conductive electrode are dipped into the electropolishing or electroetching solution. Typically an anodic (positive) voltage is applied to the material to be removed with respect to the conductive electrode. With the applied voltage, the material is electrochemically dissolved and removed from the wafer surface.

Whether a CMP process, an etching process or an electroetching process is employed, it is desirable to reduce the copper overburden thickness that needs to be removed by these processes. The importance of overcoming the copper overburden problem is evidenced by technological developments directed to the deposition of planar and thin copper layers on the wafer surfaces. Such planar deposition techniques are generally called Electrochemical Mechanical Deposition (ECMD). In such planar processes, a pad, a mask or a sweeper, which is collectively called a Workpiece Surface Influencing Device (WSID), can be used during at least a portion of the electrodeposition or electroetching processes when there is physical contact or close proximity, and relative motion between the workpiece surface and the WSID.

The edge exclusion problem may be overcome using deposition technologies that deposit materials across the full face of wafers. For example, U.S. application Ser. No. 09/735,546 entitled "Method and Apparatus For Making Electrical Contact To Wafer Surface for Full-Face Electroplating or Electropolishing," filed on Dec. 14, 2000 and commonly owned by the assignee of the present invention, describes in one aspect a technique for providing full face electrotreating. It should be noted that electrotreating refers to all electrochemical processes, which are sometimes called by different names. Therefore, electrotreating includes, for example, electrodeposition or plating, electroetching or electropolishing, etc. U.S. application Ser. No. 09/760,757 entitled "Method and Apparatus for Electrodeposition of Uniform Film with Minimal Edge Exclusion on Substrate," filed on Jan. 17, 2001 and commonly owned by the assignee of the present invention describes in one aspect a technique for forming conductive layers on a semiconductor wafer surface without losing space on the surface for electrical contacts. As exemplified in these applications, copper deposition or electroetching on a wafer surface can be achieved using electrical contacts to contact the wafer in a slidable manner, i.e. a relative motion is established between the contacts and the wafer surface during process so that material is deposited on or removed from the whole workpiece surface including the areas right under the contacts. While previously described electrical contacts are adequate, needed is an improved contact structure, which provides for even greater consistency than the established electrical contacts.

SUMMARY OF THE INVENTION

The presently preferred embodiments described herein include systems and methods for providing electrical contacts to the surface of a workpiece such as a semiconductor wafer to facilitate electrotreating processes, including electroplating and electroetching processes. The present invention provides improved contact structures, which provide for greater consistency than conventional electrical contacts.

BRIEF DESCRIPTION OF THE DRAWINGS

The foregoing and other features, aspects, and advantages will become more apparent from the following detailed description when read in conjunction with the following drawings, wherein.

DETAILED DESCRIPTION OF THE PRESENTLY PREFERRED EMBODIMENTS

The present invention will now be described in detail with reference to the accompanying drawings, which are provided as illustrative examples of preferred embodiments of the present invention.

Figure 1:
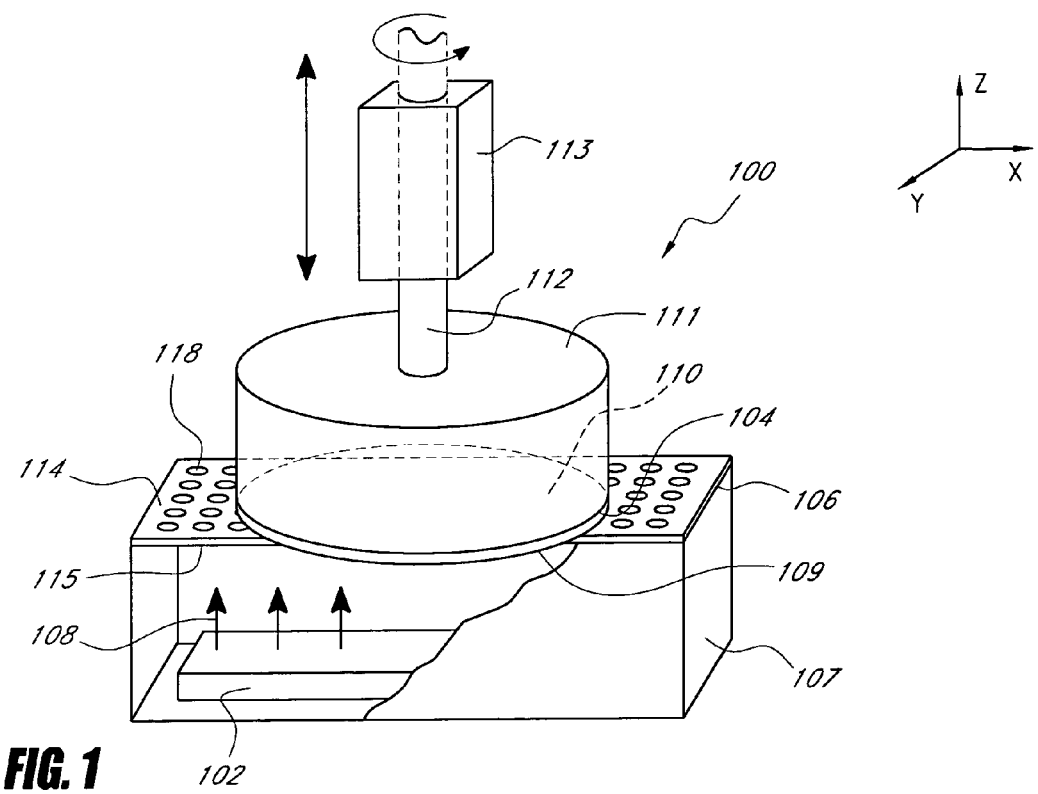
FIG. 1 is a diagram illustrating a perspective view of an exemplary electrotreating system according to a presently preferred embodiment.

Referring now to FIG. 1, it is a diagram illustrating a perspective view of an exemplary electrotreating system 100 according to a presently preferred embodiment. FIG. 1 schematically shows an exemplary electrotreating system 100 which is capable of performing both electroplating and electroetching processes. The exemplary electrotreating system of the present invention may be one having the capability of planar electroplating and planar electroetching such as an Electrochemical Mechanical Deposition (ECMD) or Electrochemical Mechanical Etching (ECME) system. It should be noted that these systems are collectively referred to as Electrochemical Mechanical Processing (ECMPR) systems. The exemplary ECMPR system 100 includes an electrode 102, a workpiece 104, and a workpiece surface influencing device (WSID) 106. The WSID 106 may be, for example, a mask, a mask plate, a pad, a sweeper, or other suitable surface influencing device. The WSID 106 may be over a cavity or a cup 107. A solution 108 fills the cup 107 and touches the electrode 102 and the work piece 104. If plating is to be performed, or both plating and electropolishing are to be performed, the solution 108 will typically contain the ionic species of the metal to be deposited and additives for good quality film formation. For plating or plating and etching, an exemplary copper plating solution may be, for example, a copper sulfate solution with additives that are commonly used in the industry. If only electropolishing is to be performed, however, the solution 108 used may be a typical electroetching/polishing solution, which does not contain ionic species of the material to be etched. For copper electroetching, solutions containing an acid, such as phosphoric acid are common. The workpiece 104 may be, for example, a silicon wafer to be plated with a conductor metal, preferably copper or copper alloy. The wafer 104 includes a front surface 109 to be plated with copper and a bottom surface 110 to be held by a carrier head 111. The carrier head 111 is rotated by a shaft 112 or spindle. The shaft 112 is placed through a non-rotating shaft housing 113, which is movably attached to a support structure (not shown). The shaft housing can be simultaneously moved with the shaft 112 and the carrier head 111 when the shaft 112 and the carrier head 111 are moved along the z or x directions. The WSID 106 includes a top surface 114, a bottom surface 115, and channels 118 or openings extending between the top and the bottom surfaces 114, 115. The channels 118 may have any form, size, or may form any pattern on the WSID 106 for better film uniformity. Any channel 118 shape that allows fluid communication between the wafer 104 and the electrode 102 through the WSID 106 can be used. Although in FIG. 1 the WSID 106 has a rectangular shape, it may be shaped in any geometrical form. In U.S. application Ser. No. 09/960,236 entitled "Mask Plate Design," filed on Sep. 20, 2001, also assigned to the same assignee as the present invention, discloses various mask plate embodiments.

As previously mentioned, the exemplary electrotreating system 100 is capable of performing planar or non-planar electroplating as well as planar or non-planar electroetching. In this respect, if a non-planar process approach is chosen, the front surface 109 of the wafer 104 is brought into proximity of the top surface 114 of the WSID 106, but it does not touch it, so that non-planar metal deposition can be performed. Further, if a planar process approach is chosen, the front surface 109 of the wafer 104 contacts the top surface 114 of the WSID 106 in one aspect of the invention. As the plating solution, depicted by arrows 108, is delivered through the channels 118, the wafer 104 is moved while either the front surface 109 contacts the top surface 114 or is in close proximity of the top surface 114 of the WSID 106. The wafer 104 may be moved rotationally which may be clockwise or counter clockwise, or it can be moved laterally along the x-axis of the WSID 106, or it can be both rotated and moved laterally. Under an applied potential between the wafer 104 and the electrode 102, and in the presence of the solution 108 that fills the channels 118, the metal such as copper, is plated on or etched off the front surface 109 of the wafer 104. It is noted, however, that the above description described rotation and movement of the wafer 104, while assuming that the WSID 106 was stationary. It is understood that the system 100, as described above, will allow for either the wafer or the WSID to move, or for both of them to move, thereby creating the same relative motion effect. For ease of description, however, the invention was above-described and will continue to be described in terms of movement of the wafer.

Figure 2:
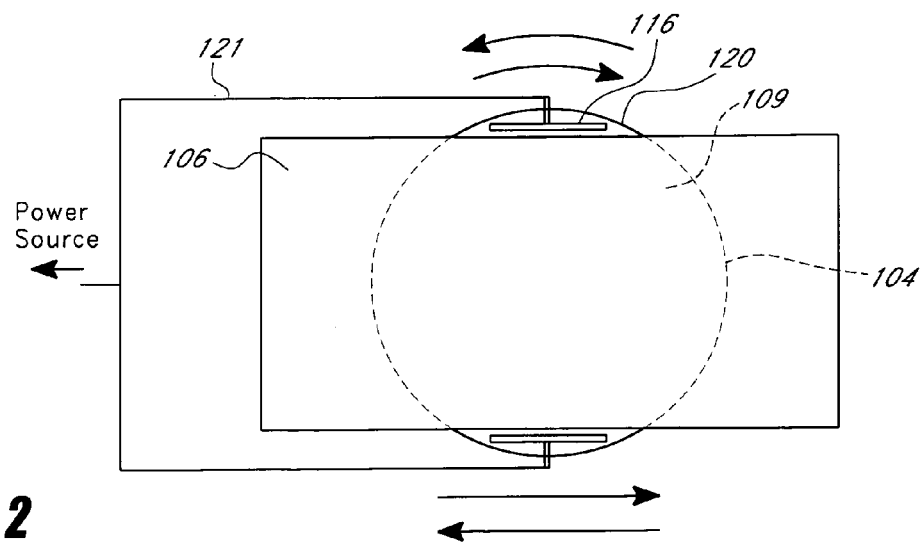
FIGS. 2 and 3 are diagrams illustrating a bottom view and a side view, respectively, of the exemplary electrotreating system of FIG. 1 including an exemplary pair of electrical contacts.
Figure 3:
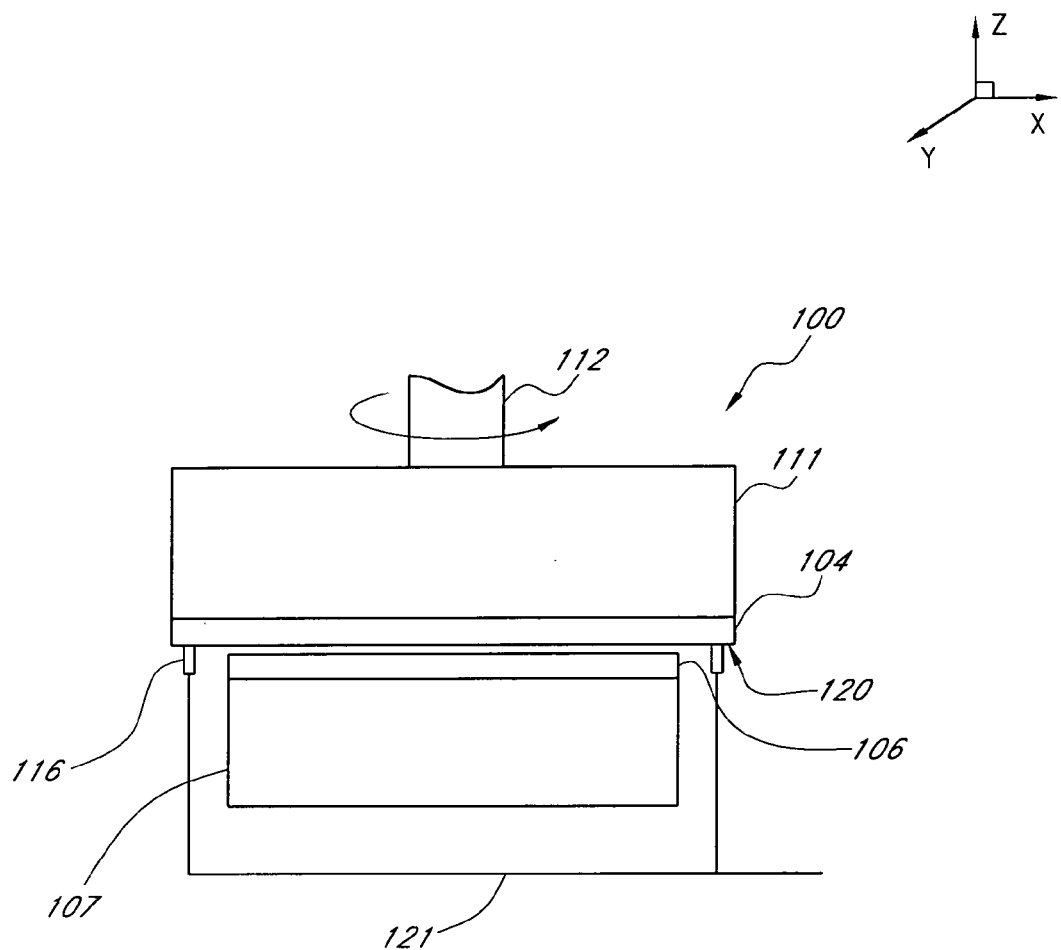

FIGS. 2 and 3 are diagrams illustrating a bottom view and a side view, respectively, of the exemplary electrotreating system 100 of FIG. 1 including an exemplary pair of electrical contacts 116. As shown in FIGS. 2 and 3, during electroplating or electroetching processes, cathodic or anodic potentials can be applied through the electrical contacts 116 that touch an exposed edge 120 of the front surface 109 of the wafer 104 as the wafer 104 is moved, i.e., moved laterally, rotated, or both rotated and moved laterally. The electrical contacts 116 are connected to a power source terminal (not shown) through electrical lines 121. In accordance with the principles of the present invention, electrical contacts 116 may include unidirectional or bi-directional contact members. As exemplified in FIGS. 4A through 5B, the contact members preferably used for cases when the wafer is rotated either in clockwise direction or counter clockwise direction. However, as exemplified in FIGS. 6A through 9D, there are shown contact members preferably used for rotation in both directions. Referring also to FIGS. 10A through 12A and as will be described more fully below, the electrical contacts 116 of the system 100 can also be made stationary, laterally movable and vertically movable.

Figure 4A:
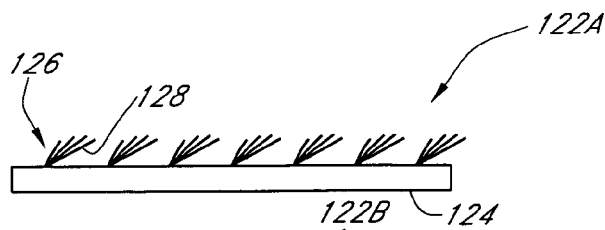
FIGS. 4A through 4C are diagrams illustrating side views of exemplary contact members according to a first presently preferred embodiment and according to the exemplary electrotreating system of FIGS. 1 through 3.
Figure 4B:
Figure 4C:
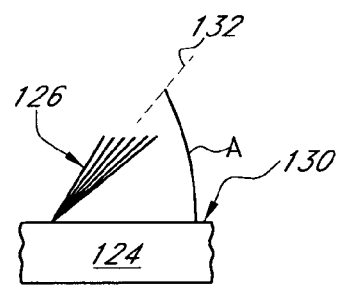

FIGS. 4A through 4C are diagrams illustrating side views of exemplary contact members 122A, 122B according to a first presently preferred embodiment and according to the exemplary electrotreating system 100 of FIGS. 1 through 3. As illustrated in FIGS. 4A and 4B, the contact members 122A, 122B include a base 124 and one or more contact elements 126. In this embodiment the contact elements 126 are brushes that are made of bundles of conductive bristles 128 or wires. Bristles 128 may, for example, be made of flexible alloy wires, Pt alloy wires or stainless steel wires or the like. The base 124 may be made of copper, stainless steel, titanium or the like or may be coated as the brushes described below. The brushes 126 are preferably made from, or coated with, conductive materials that do not react with the solutions used, and if used for deposition, resist Cu plating. Materials or coatings such as platinum, platinum alloys, Ta, TaN, Ti, TiN and the like can be used. These conductive materials and considerations are preferably used for the other embodiments described below.

The brush 126 can have a length in the range of 1 to 4 cm, preferably 2–3 cm., although any suitable length may be used. The length of the brush and the distance pushed by the wafer surface against the bristles determine the force that is applied on the wafer surface by the brush 126. As a rule of thumb, the longer the brush, the milder the force that is applied on the wafer, and the lesser the chance of having scratches along the exposed edge 120 shown in FIG. 2. Each contact element is made up of a number of bundles, preferably 5 to 20, and most preferably at least 10, with each bundle having a number of individual wires, such as between 20 to 300, preferably in the range of 50 to 200, if 0.002 inch thick wire is used, but will vary as needed. In this embodiment, because the brushes 126 are slanted to the right, the contact member 122A is preferably used when the wafer 104 is rotated in way that it travels to the right over the contact elements 126. Similarly, the contact member 122B is preferably used when the wafer 104 is moving to the left over the brushes.

As shown in FIG. 4C, the angle of slant, depicted by 'A', for brushes 126 in both contact members 122A and 122B is about 45 degrees, so that the angle of slant is preferably between 30 to 60 degrees, although any suitable angle may be used. The angle of slant 'A' is the angle measured between an upper surface 130 of the base 124 and a slant axis 132 that is symmetrically crossing the center of the brush 126. The angle of slant allows the brushes 126 to flex easily and uniformly as the wafer 104 makes contact with the contact members 122A or 122B.

Figure 5A:
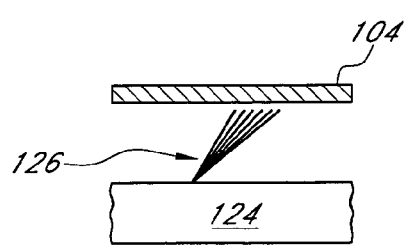
FIGS. 5A and 5B are diagrams illustrating the interaction of the exemplary contact members of FIGS. 4A through 4C with the workpiece of FIGS. 1 through 3.
Figure 5B:
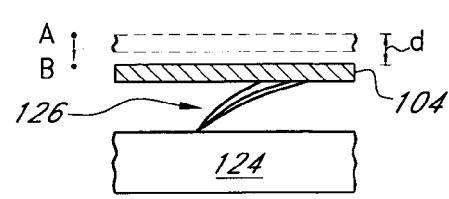

FIGS. 5A and 5B are diagrams illustrating the interaction of the exemplary contact members of FIGS. 4A through 4C with the workpiece 104 of FIGS. 1 through 3. In operation, as shown in FIGS. 5A and 5B, as a wafer 104 moves from a first position 'A' to a second position 'B' along a distance d, the brush 126 is pressed down by the same distance d. As the distance d gets longer, the force applied on the wafer 104, as well as the chance of scratching the wafer 104, increase. However, as the angle "A" gets smaller (FIG. 4C), the force gets lower, and there is less chance of scratching the wafer 104.

Figure 6A:
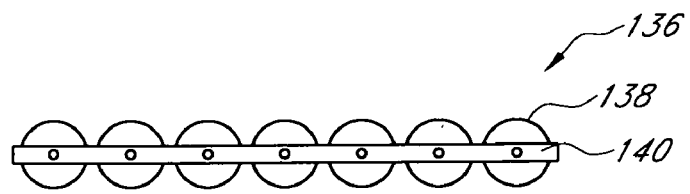
FIGS. 6A through 6C are diagrams illustrating side views of exemplary contact members according to a second presently preferred embodiment and according to the exemplary electrotreating system of FIGS. 1 through 3.
Figure 6B:
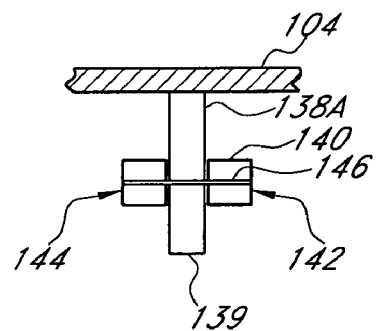

FIGS. 6A through 8B illustrate contact members that are preferably for use irrespective of the direction that the wafer is moved. Rotational direction of the wafer can be changed any time during the process. FIGS. 6A through 6C are diagrams illustrating side views of exemplary contact members 136 according to a second presently preferred embodiment and according to the exemplary electrotreating system 100 of FIGS. 1 through 3. As shown in FIG. 6A, in one embodiment, the contact member 136 includes a series of contact elements 138 that are assembled into a base 140, preferably a base frame. In this embodiment, the contact elements 138A are rollers. Further, as shown in FIG. 6B, the rollers 138A are preferably disk shaped with a flat contact surface 139 that enable the rollers 138A to roll over the wafer 104 surface while establishing electrical contact. Because of the flat surface 139 of the rollers 138A, the rollers 138A of the contact member 136 are held in a perpendicular posture on the wafer 104 when the member 136 makes contact to the wafer 104. The base frame 140 may have a first frame halve 142 and a second frame halve 144. The rollers 138A are movably held between the first and the second halves 142, 144 by pins 146 which are placed through the centers of the rollers 138A and secured to the halves 142, 144 from both ends of the pins 146.

Figure 6C:
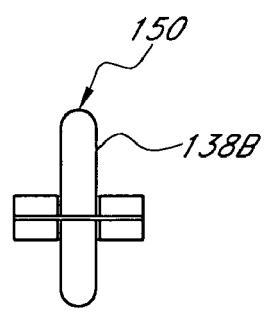

FIG. 6C shows an alternative roller design, with rollers 138B, having a round contact surface 150. Similar to the rollers 138A described above, the rollers 138B are held between the first and second halves 142, 144 of the base frame 140 by a number of pins 146. The round contact surface 150 of the rollers 138B enables them to contact the wafer 104 surface at an angle. In both designs, the rollers 138A, 138B may be furnished with suitable mechanical biasing mechanisms to enhance their contact ability with the wafer 104 surface. Such biasing mechanisms can be, but not limited to, springs that are placed adjacent the pins 146 and biasing the rollers 138A, 138B towards the wafer 104. Such biasing mechanisms may also assist the rollers 138A, 138B to move smoothly on the surface of the wafer 104.

Figure 7A:
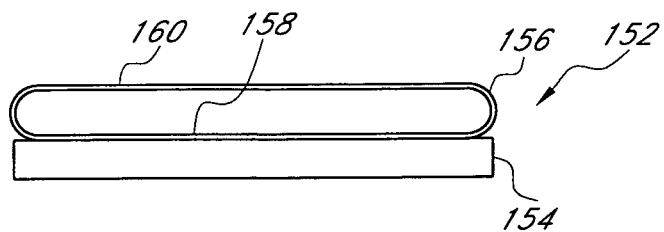
FIGS. 7A through 7B are diagrams illustrating side views of exemplary contact members according to a third presently preferred embodiment and according to the exemplary electrotreating system of FIGS. 1 through 3.
Figure 7B:
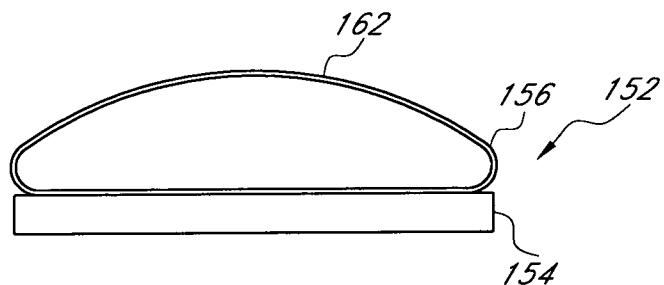

FIGS. 7A through 7B are diagrams illustrating side views of exemplary contact members 152 according to a third presently preferred embodiment and according to the exemplary electrotreating system 100 of FIGS. 1 through 3. FIGS. 7A and 7B show the contact member 152 having a base 154 and a contact element 156. In this embodiment the contact element 156 is a loop contact having a loop-shape configuration. The loop contact 156 may be attached to the base 154 through a lower portion 158 of the contact 156. In this embodiment, an upper portion 160 of the contact 156 may preferably be made flat. The loop contact makes physical and electrical contact with the wafer surface through the upper portion 160 when it is placed on the wafer. The loop shape of the loop contact 156 enhances the contact that occurs during its placement on the wafer by creating a spring action against the wafer. As shown in FIG. 7B, in another design, the loop contact 156 may have an upper portion 162 with curved or convex shape. The loop contact may be made of conductive wires, strips or flat pieces. The base 154 is preferably made of a conductive material. It should be noted that the loops in FIG. 7A or 7B may be empty loops, or there may be a compressible material such as a foam material inside the loop to support the upper portion 160 better.

Figure 8A:
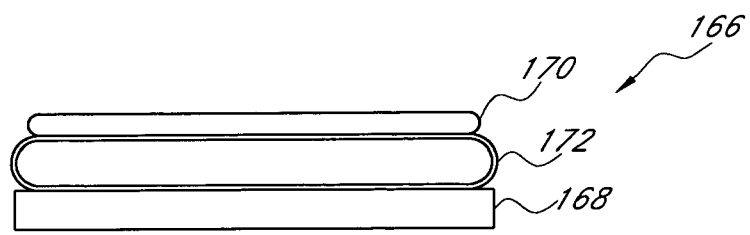
FIGS. 8A through 8B are diagrams illustrating side views of exemplary contact members according to a fourth presently preferred embodiment and according to the exemplary electrotreating system of FIGS. 1 through 3.
Figure 8B:
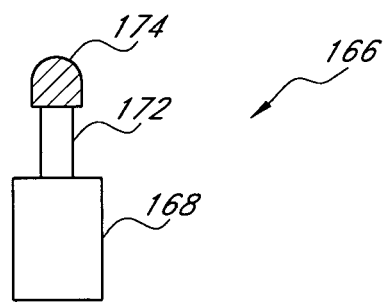

FIGS. 8A through 8B are diagrams illustrating side views of exemplary contact members 166 according to a fourth presently preferred embodiment and according to the exemplary electrotreating system of FIGS. 1 through 3. FIG. 8A shows the contact member 166 having a base 168 and a contact element 170. The contact element 170 may be a conductive bar attached to the base 168 by at least a pair of flexible members 172, such as leaf springs. As shown in FIG. 8B in a side view, the bar 170 may have a round upper portion 174 allowing the contact member to be placed on the wafer at an angle. The flexible members 172 push the bar 170 against the wafer and thereby enhance electrical contact between the wafer and the contact member. The base and the flexible members are all preferably made of conductive materials. It should be noted that the contact element 170 may be a thin conductive foil such as a 25–1000 micron thick metallic foil. In this case, to support this thin foil, the flexible members 172 are replaced by a compressible member (not shown) such as a foam material that is placed between the contact element 170 and the base 168.

Figure 9A:
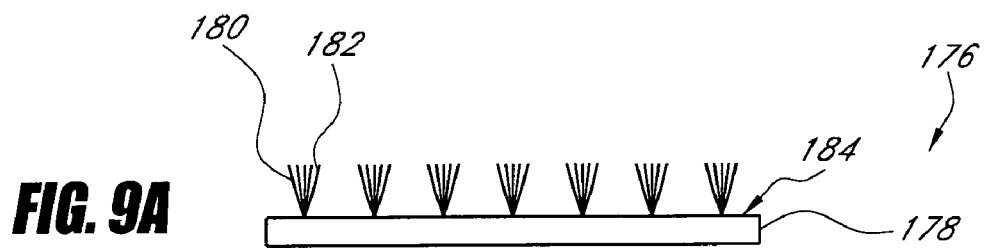
FIG. 9A is a diagram illustrating a side view of an exemplary contact member according to a fifth presently preferred embodiment and according to the exemplary electrotreating system of FIGS. 1 through 3.
Figure 9B:
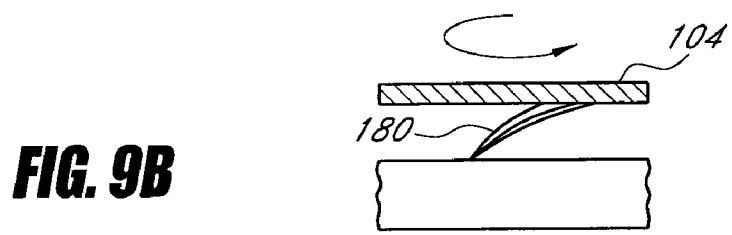
FIGS. 9B through 9D are diagrams illustrating the interaction of the exemplary contact member of FIGS. 9A with the workpiece of FIGS. 1 through 3.
Figure 9C:
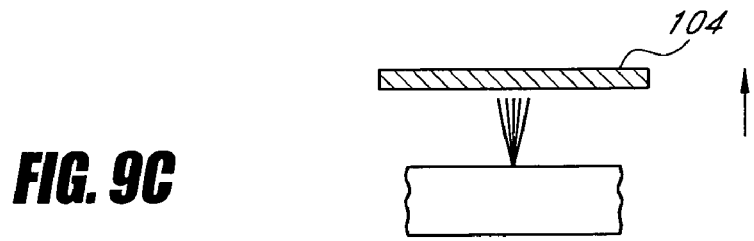
Figure 9D:
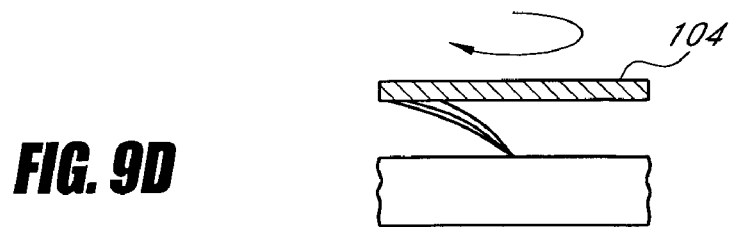

FIGS. 9B through 9D are diagrams illustrating the interaction of the exemplary contact member 176 of FIGS. 9A with the workpiece 104 of FIGS. 1 through 3. FIGS. 9A through 9D show the contact member 176, which can be used as a bi-directional contact. As shown in FIG. 9A, the contact member 176 includes a base 178 and one or more contact elements 180. In this embodiment, the contact elements 180 are brushes that are made of bundles of conductive bristles 182 or wires. Bristles 182 may, for example, be made of flexible alloywires, such as stainless steel wires or the like. The base 178 is preferably made of a conductive material. The brush 180 can have a length in the range of 1 to 5 cm., preferably 2 to 3 cm., although any suitable length may be used. The length of the brush 180 determines the force that can be applied on the brush 180. As a rule of thumb, the longer the brush, the milder the force that is applied on the wafer 104, and the lesser the chance of having scratches along the exposed edge 120 shown in FIG. 2. Each contact member is made up of a number of bundles, preferably 5 to 20, and most preferably at least 10, with each bundle having a number of individual wires, such as between 20 to 300, preferably in the range of 100 to 200, if 0.002 inch thick wire is used, but will vary as needed. The brushes are preferably slanted at angles of between 30 and 60 degrees, preferably 45 degrees, as shown in FIGS. 4A and 4B, but could also be are placed perpendicular to an upper surface 184 of the base 178 as shown in FIG. 9A.

As shown in FIGS. 9B through 9D, the contact member 176 can be used with a wafer that is moving in either direction. As shown in FIG. 9B, as the wafer 104, which is rotating in the counter clockwise direction, is approached and contacted with the brush 180 the brush flexes over the right side. At this point, if the rotational direction of the wafer 104 needs to be changed, the wafer is first raised above the brush 180 as shown in FIG. 9C. And, the wafer 104 is rotated in the clockwise direction while the wafer 104 is approached to the brush 180 so that the brush can be flexed over the left side.

Referring back to FIGS. 1 through 3, as previously mentioned, the system 100 may include stationary, laterally movable, or vertically movable electrical contact structures. Again, as previously mentioned, each such electrical contact structure may include the above described contact member embodiments.

Figure 10A:
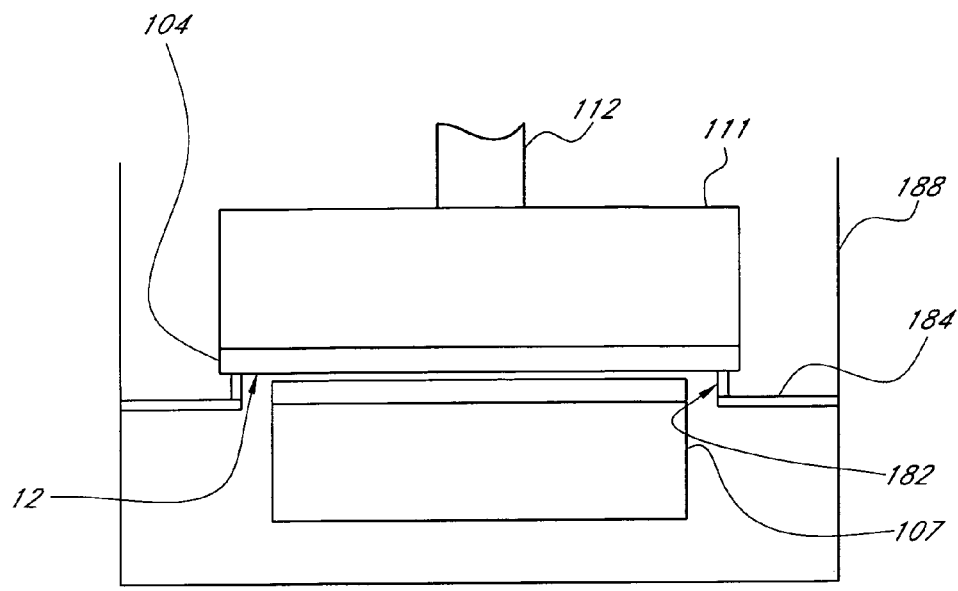
FIGS. 10A and 10B are diagrams illustrating a side view and a bottom view, respectively, of the exemplary electrotreating system of FIG. 1 including an exemplary pair of stationary contacts and a contact member mounting arrangement that includes an enclosure.
Figure 10B:
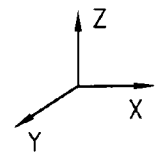
Figure 10B:
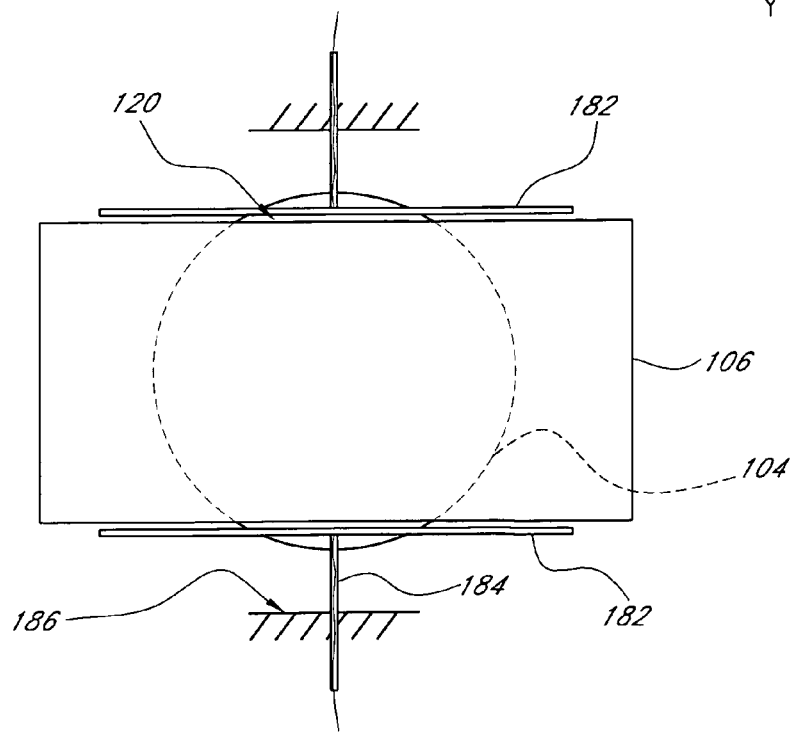

FIGS. 10A and 10B are diagrams illustrating a side view and a bottom view, respectively, of the exemplary electrotreating system 100 of FIG. 1 including an exemplary pair of stationary contacts 182 and a contact member mounting arrangement that includes an enclosure 188. As illustrated in FIGS. 10A and 10B, the stationary contacts 182 can be integrated with the system 100. The stationary contacts 182 can be any of the specific contact members described in detail above with regard to the above described embodiments. An exemplary brace portion 184 of the stationary contact 182 connects the stationary contact 182 to the enclosure 188 that contains the system 100, or it may be simply fixed onto the cup 107 (not shown). It is understood that, in this embodiment, the stationary contacts 182 are stationary with respect to the WSID 106. The stationary contacts 182 can be positioned adjacent the WSID 106. The stationary contacts 182 may be biased toward the wafer 104 with a biasing mechanism (not shown), such as a spring, to provide better contact between the contacts 182 and the wafer 104. FIG. 10B shows the position of the stationary contacts 182 with respect to the WSID 106 and the wafer from a partial bottom view. As the wafer 104 is rotated in clockwise or counter clockwise directions as well as laterally moved in the x-direction, the stationary contacts 182 touch the exposed edge 120 of the wafer 104. For clarity of illustration, electrical connections to the contact elements have not been shown in any of the figures. Commonly known means and techniques can be used to provide electrical power to the contact elements. In this embodiment, the stationary contacts may have a predetermined length that is based on the size of the wafer, size and shape of the WSID 106 and the amount of the lateral motion of the wafer on the WSID. The length of the stationary contacts should be such adjusted that the exposed edge 120 is continuously contacted by at least some of the stationary contacts. In addition, as illustrated in FIG. 10A, the height of the stationary contacts may preferably be above the level of any solution directly above the WSID so that the wafer 104 touches the contacts and voltage can be applied to the wafer 104 via the contacts prior to any contact between the wafer 104 and the solution from the cup 107.

Figure 11A:
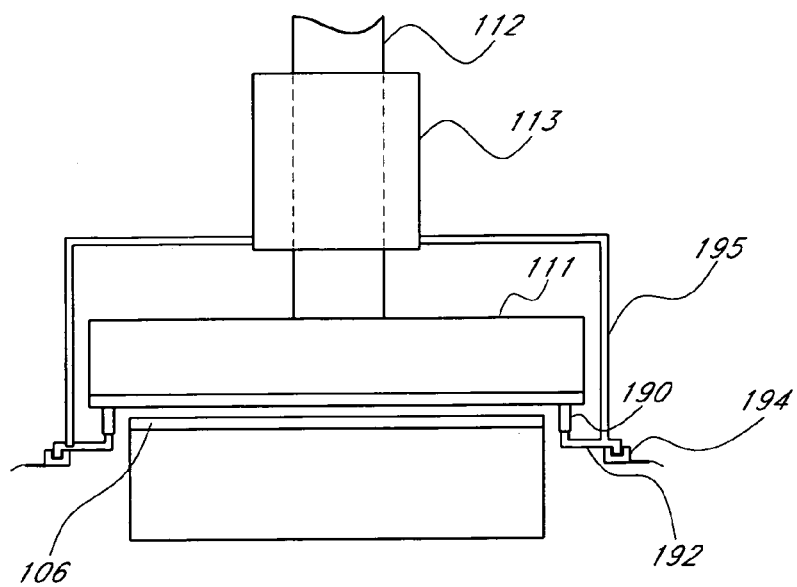
FIGS. 11A and 11C are diagrams illustrating a side view and a bottom view, respectively, of the exemplary electrotreating system of FIG. 1 including an exemplary pair of laterally moving contacts and a contact member mounting arrangement that includes a guide mechanism.
Figure 11B:
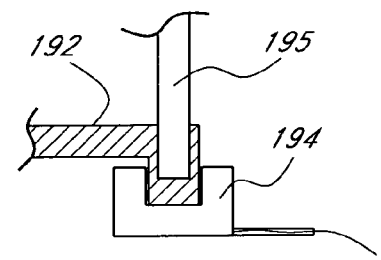
FIG. 11B is a diagram illustrating a detail side view of a portion of the mounting arrangement of FIGS. 11A and 11C.
Figure 11C:
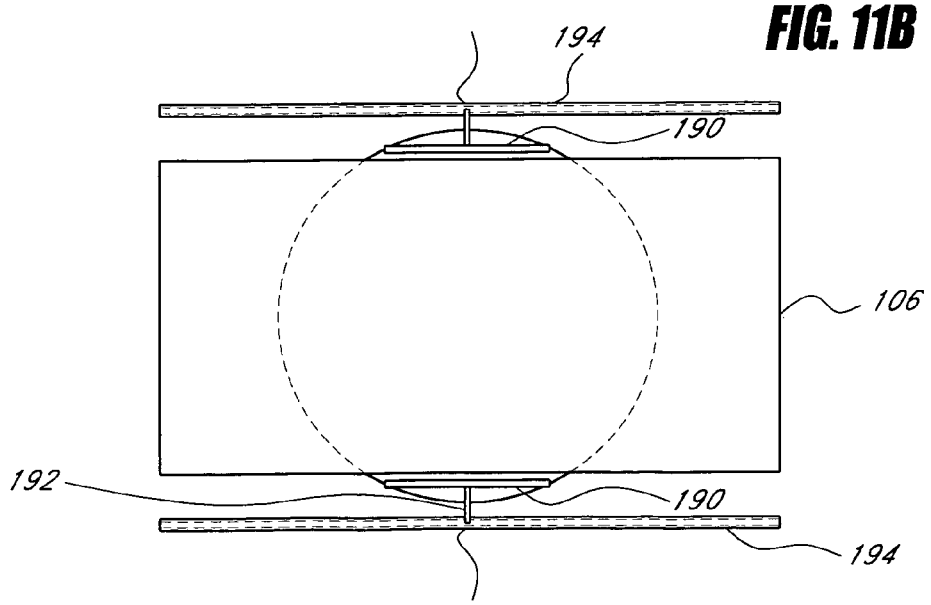
Figure 11D:
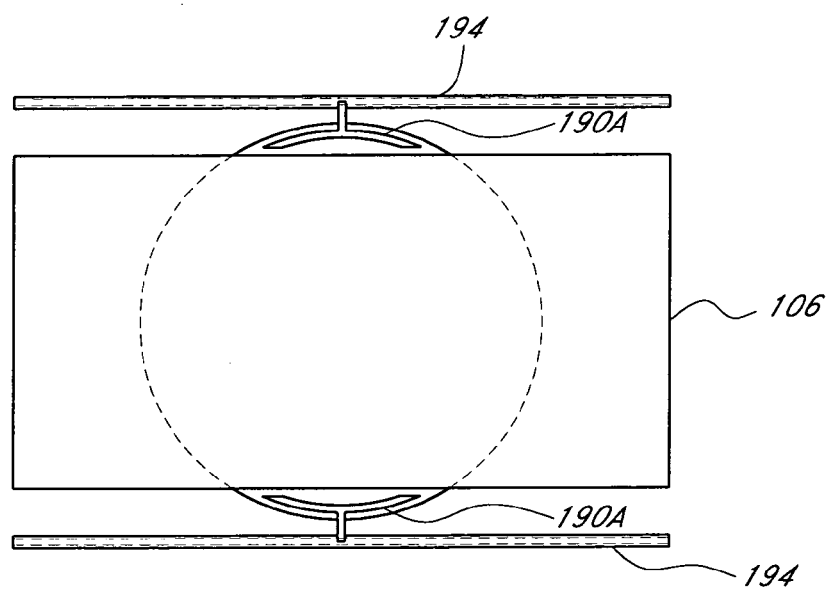
FIG. 11D illustrates an other embodiment of a curved contact member.

FIGS. 11A and 11C are diagrams illustrating a side view and a bottom view, respectively, of the exemplary electrotreating system 100 of FIG. 1 including an exemplary pair of laterally moving contacts 190 and a contact member mounting arrangement which includes a guide mechanism. The laterally moving contacts 190 can be any of the specific contact members described in detail above with regard to the above-described embodiments. FIG. 11B is a diagram illustrating a detailed side view of a portion of the mounting arrangement of FIGS. 11A and 11C. As illustrated in FIGS. 11A through 11C, a laterally moving contact 190 can be integrated with the system 100. A brace portion 192 connects the laterally moving contact 190 to a guide mechanism 194. As shown in FIG. 11B in cross section, the guide mechanism 194 can be a rail that accommodates an end of the brace portion 192 and allows the end of the brace portion 192 to move along the rail 194. The lateral motion of the contact 190 is provided by motion rods 195 that are permanently attached to the shaft housing 113. The lower end of the rods 195 can be removably inserted into a hole in the end of the brace 192 when the carrier head is lowered down. As the carrier head 111 moves laterally in the x-direction during the process, the rods 195 move the brace 192 in the rail 194 and thereby the contacts 190 are moved along with the wafer laterally. Alternatively, the contacts 190 can be connected to a moving mechanism (not shown) that is controlled by a controller (not shown) that causes the movement of the contacts 190 to correspond to the lateral motion of the carrier head 111. The contacts 190 may be biased toward the wafer 104 with a spring (not shown) for better conductivity between the contacts 190 and the wafer 104. FIG. 11C shows the position of the contacts 190 with respect to the WSID 106 and the wafer from a partial bottom view. As the wafer 104 is rotated in clockwise or counter clockwise directions as well as laterally moved in the x-direction, the contacts 190 continue making contact with the exposed edge 120 of the wafer 104 by moving with the wafer 104. Therefore, they do not have to be as long as those in the case of stationary contacts of FIG. 10B, and they do not necessarily be straight. As illustrated by the embodiment illustrated in FIG. 11D that shows contacts 190A, the contacts 190A can have a curved shape that follows the contour of the wafer edge. As also illustrated in FIG. 11B, the height of the stationary contacts can preferably be above the level of any solution directly above the WSID so that the wafer 104 touches the contacts and voltage can be applied to the wafer 104 via the contacts prior to any contact between the wafer 104 and the solution from the cup 107.

Figure 12A:
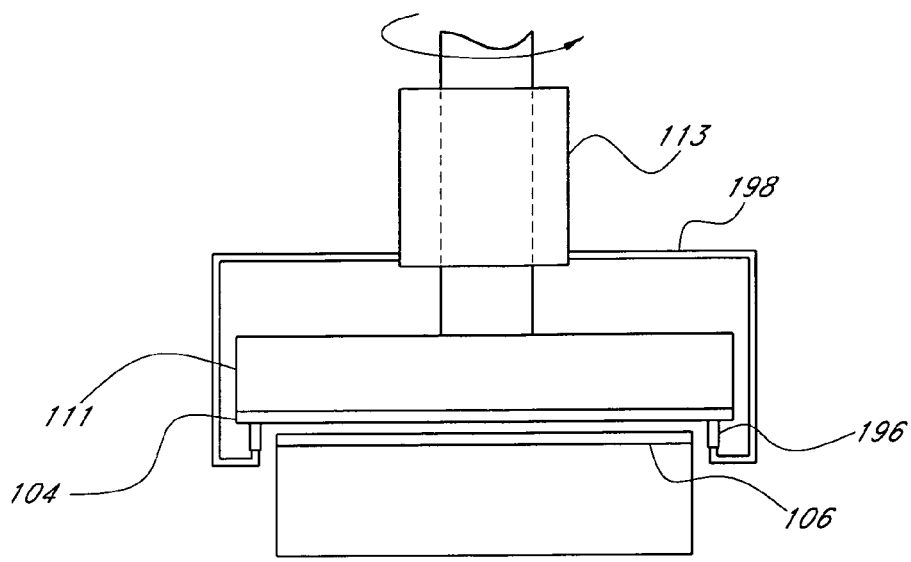
FIGS. 12A and 12B are diagrams illustrating a side view and a bottom view, respectively, of the exemplary electrotreating system of FIG. 1 including an exemplary pair of vertically movable contact members and a contact members mounting arrangement.
Figure 12B:
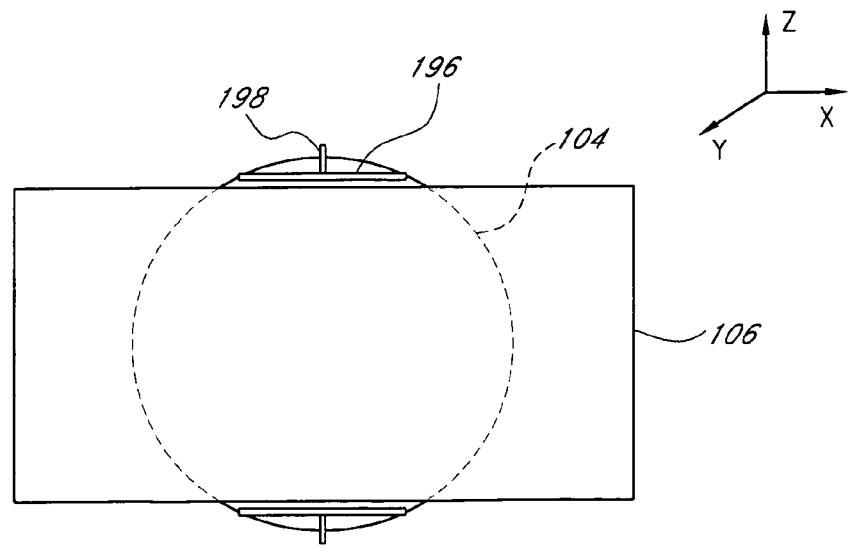

FIGS. 12A and 12B are diagrams illustrating a side view and a bottom view, respectively, of the exemplary electrotreating system 100 of FIG. 1 including an exemplary pair of vertically and laterally movable contacts 196 and a contact members mounting arrangement. As illustrated in FIGS. 12A and 12B, a vertically movable contact 196 can be integrated with the system 100. The vertically moving contacts 196 can be any of the specific contact members described in detail above with regard to the above described embodiments. A brace portion 198 of the vertically movable contact 196 may be attached to the shaft housing 113. As mentioned above the shaft housing 113 can move vertically with the carrier head in the z direction as well as laterally in the x direction. As the carrier head 111 moves vertically in the z-direction during the process, the contacts 196 keep their position along the exposed edge 120. In this embodiment, since the only relative motion between the contacts 196 and the wafer is rotational, this design allows an operator to adjust the pressure between the contacts 202 and the wafer to a desired fixed level before the process and consequently keep the pressure at that desired level. Lack of relative lateral motion between the contacts 196 and the wafer 104 reduces mechanical abrasion that may be caused by the contacts 196 over the exposed edge 120. Alternatively, the contacts 196 can be connected to a moving mechanism (not shown) that is controlled by a controller (not shown) that causes the movement of the contacts 196 to correspond to the vertical motion of the carrier head 111. The contacts 196 may be biased toward the wafer 104 with a spring (not shown) for better conductivity between the contacts 196 and the wafer 104. FIG. 12B shows the position of the contacts 196 with respect to the WSID 106 and the wafer from a partial bottom view. As the wafer 104 is rotated in clockwise or counter clockwise directions as well as laterally moved in the x-direction, the contacts 196 continue making contact with the exposed edge 120 of the wafer 104. In this embodiment the contacts 196 need to be moved out of the way by a mechanism (not shown) during the loading of the wafer 104 on the carrier head 111. After loading the wafer contacts make physical contact to its surface and the process is initiated. Similar to the case discussed with respect to FIGS. 11A and 11C, as the wafer 104 is rotated in clockwise or counter clockwise directions as, well as laterally moved in the x-direction, the contacts 196 continue making contact with the exposed edge 120 of the wafer 104 by moving with the wafer 104. Therefore, they do not have to be as long as those in the case of stationary contacts of FIG. 10B, and they do not necessarily be straight. They can have a curved shape that follows the contour of the wafer edge.

Figure 13A:
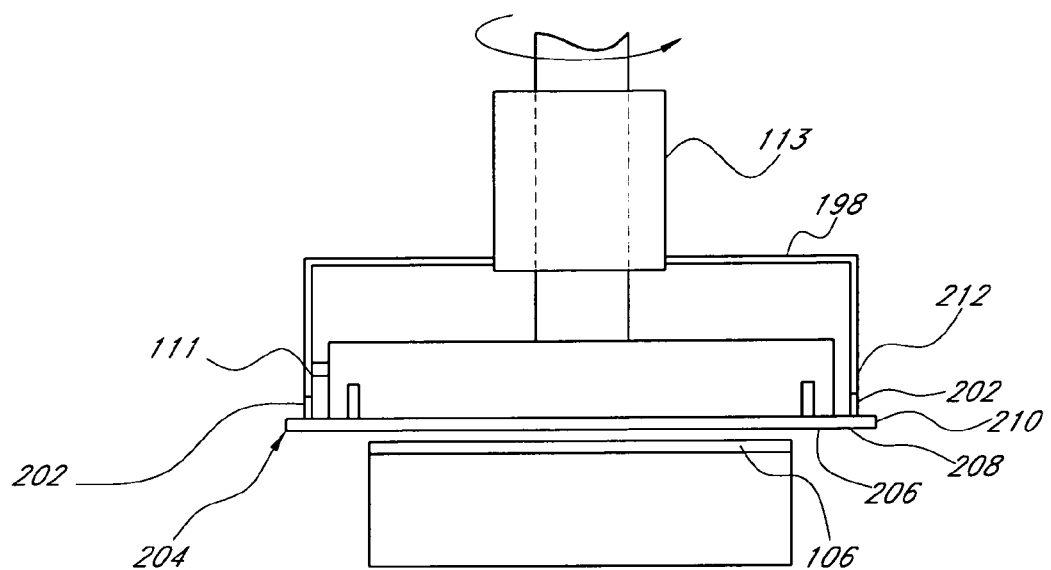
FIGS. 13A and 13B are diagrams illustrating embodiments of the present invention using back-side contacts.

FIG. 13A illustrates a side view of the exemplary electrotreating system 100 of FIG. 1 including an exemplary back-side contacts 202 and a contact member mounting arrangement associated therewith. As illustrated in FIG. 13A, the back-side contact 202 can be integrated with the system 100. The back-side contacts 202 can be any of the specific contact members described in detail above with regard to the above described embodiments. In this embodiment, the wafer 204 will have a conductive layer 206, typically a seed layer, that extends from the frontside 208, around the bevel portion 210, to the backside 212, so that electrical contact can be maintained between the wafer 204 and the back-side contact 202 from the back-side of the wafer. In this embodiment, the contact member that holds the contacts 202 can be attached. A brace portion 198 of the back-side contact 202 may be attached to the shaft housing 113. As mentioned above the shaft housing 113 can move vertically with the carrier head in the z direction as well as laterally in the x direction. As the carrier head 111 moves vertically in the z-direction during the process, the contacts 196 keep their position along the exposed backside edge. In this embodiment, since the only relative motion between the contacts 202 and the wafer is rotational, this design allows an operator to adjust the pressure between the contacts and the wafer to a desired fixed level before the process and consequently keep the pressure at that desired level. Lack of relative lateral motion between the contacts 202 and the wafer 204 reduces mechanical abrasion. Alternatively, the contacts 202 can be connected to a moving mechanism (not shown) that is controlled by a controller (not shown) that controls the vertical motion of the carrier head 111. The contacts 202 may be biased toward the wafer 204 with a spring (not shown) for better conductivity between the contacts 202 and the wafer 204. Alternatively, the contact member and back-side contacts 202 can be disposed within the carrier head 111, such that electrical contact is established once the wafer 204 is placed onto the carrier head 111, as shown by the dotted line in FIG. 13A within the carrier head 111. It should be noted that contact may also be made right at the edge (bevel) of the wafer.

Figure 13B:
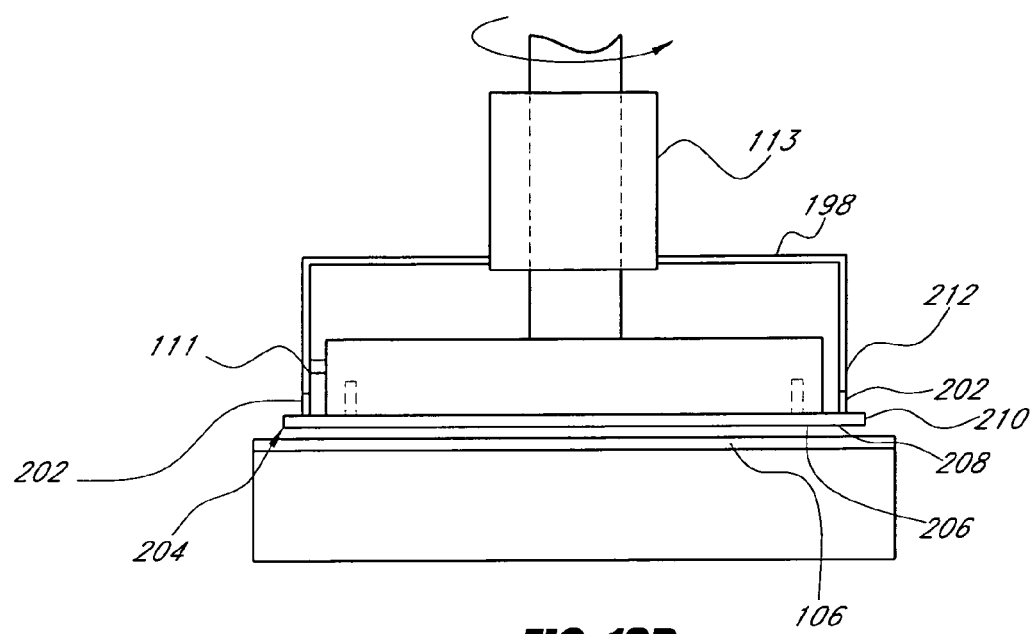

FIG. 13B illustrates another embodiment of a system that provides backside contacts. As illustrated, the WSID 106A has dimensions that are larger than the wafer in all dimensions, such that the entire wafer is exposed to the WSID 106A and the process solution during processing.

Cleaning of the contacts is also a consideration. In one aspect, conventional contacts are, in many instances coated with Cu, Pt, Pd or other materials to ensure repeatability. In time, however, they deteriorate due to corrosion and the like. Such corrosion will change uniformity if the contact is stationery with respect to the wafer, but the uniformity will average out if the contact moves with respect to the wafer, as it will with the present invention. In another aspect, actual cleaning of the contacts can extend their life and increase the uniformity of the contact. Methods of cleaning include electropolishing during the processing of a wafer, while electropolishing the wafer, usage of a conditioning wafer after processing some number of wafers, either with our without electropolishing occurring, or removal of the contacts from the system and cleaning them using conditioning pads, electropolishing, or other conventional cleaning operations.

Although the present invention has been particularly described with reference to the preferred embodiments, it should be readily apparent to those of ordinary skill in the art that changes and modifications in the form and details may be made without departing from the spirit and scope of the invention. It is intended that the appended claims include such changes and modifications.

What is claimed is:

1. A system for electrical contact with a wafer having a conductive layer with an edge surface on a front surface thereof during processing of the wafer, comprising:
   at least one contact member that establishes electrical contact with the conductive layer only at the edge surface of the wafer, the at least one contact member comprising a base support member and at least one contact element coupled to the base support member, wherein the at least one contact element maintains continuous electrical contact with a respective exposed edge of the front surface of the workpiece and comprises a brush, the brush including a bundle of conductive wires that contact the front surface of the workpiece at a slant angle so that the workpiece is uni-directionally rotatable against the at least one contact member and the relative movement between the at least one contact member and wafer during processing of the wafer cause the at least one contact member to electrically contact different parts of the edge surface of the wafer.

2. The system according to claim 1 wherein the contact element includes a plurality of bundles of conductive wires adapted to each contact the front surface of the workpiece at the slant angle, thereby ensuring that at least one of the plurality of bundles of wires electrically contacts the front surface of the workpiece when lateral movement of the front surface of the workpiece relative to the contact element occurs.

3. The system according to claim 1, wherein the conductive wires of the brush permit bending so that the workpiece is vertically movable against the at least one contact member.

4. A system for electrical contact with a wafer having a conductive layer with an edge surface on a front surface thereof during processing of the wafer, comprising:
   at least one contact member that establishes contact with the conductive layer at the edge surface of the wafer, the at least one contact member comprising a base support member and at least one contact element coupled to the base support member, wherein the at least one contact element maintains continuous electrical contact with a respective exposed edge of the front surface of the workpiece and comprises a brush, the brush including a bundle of conductive wires that contact the front surface of the workpiece approximately perpendicularly to the front surface of the workpiece so that the workpiece is bi-directionally rotatable against the at least one contact member and the relative movement between the at least one contact member and wafer during processing of the wafer cause the at least one contact member to electrically contact different parts of the edge of the wafer.

5. The system according to claim 4 wherein the contact element includes a plurality of bundles of conductive wires adapted to each approximately perpendicularly contact the front surface of the workpiece, thereby ensuring that at least one of the plurality of bundles of wires electrically contacts the front surface of the workpiece when lateral movement of the front surface of the workpiece relative to the contact element occurs.

6. The system according to claim 4, wherein the conductive wires of the brush permit bending so that the workpiece is vertically movable against the at least one contact member.

7. A system for electrical contact with a wafer having a conductive layer with an edge surface on a front surface thereof during processing of the wafer, comprising:
   at least one contact member that establishes electrical contact with the conductive layer at the edge surface of the wafer, the at least one contact member comprising a base support member and at least one contact element coupled to the base support member, wherein the at least one contact element maintains continuous electrical contact with a respect exposed edge of the front surface of the workpiece and comprises a roller having a contact surface that contacts the front surface of the workpiece so that the workpiece is rotatable against the at least one contact member and the relative movement between the at least one contact member and wafer during processing of the wafer cause the at least one contact member to electrically contact different parts of the edge surface of the wafer.

8. The system according to claim 7, wherein the contact surface of the roller is substantially flat and contact the front surface of the workpiece approximately perpendicularly to the front surface of the workpiece so that the workpiece is bi-directionally rotatable.

9. The system according to claim 8 wherein the contact element includes a plurality of rollers each having a flat surface adapted to each approximately perpendicularly contact the front surface of the workpiece, thereby ensuring that at least one of the plurality of rollers electrically contacts the front surface of the workpiece when lateral movement of the front surface of the workpiece relative to the contact element occurs.

10. The system according to claim 7 further including a mechanical biasing mechanism that is used to bias the roller against the front surface of the workpiece.

11. The system according to claim 10 wherein the mechanical biasing mechanism is a spring.

12. The system according to claim 7 wherein the contact surface of the roller is rounded and contacts the front surface of the workpiece so that the workpiece is bi-directionally rotatable.

13. The system according to claim 12 wherein the contact element includes a plurality of rollers each having a rounded surface adapted to each contact the front surface of the workpiece, thereby ensuring that at least one of the plurality of rollers electrically contacts the front surface of the workpiece when lateral movement of the front surface of the workpiece relative to the contact element occurs.

14. The system according to claim 12 further including a mechanical biasing mechanism that is used to bias the roller against the front surface of the workpiece.

15. The system according to claim 14 wherein the mechanical biasing mechanism is a spring.

16. The system according to claim 14 wherein the roller is configured to contact the front surface of the workpiece at a slant angle.

* * * * *

UNITED STATES PATENT AND TRADEMARK OFFICE
CERTIFICATE OF CORRECTION

| | | |
|---|---|---|
| PATENT NO. | : 7,211,174 B2 | Page 1 of 2 |
| APPLICATION NO. | : 10/283025 | |
| DATED | : May 1, 2007 | |
| INVENTOR(S) | : Bulent M. Basol et al. | |

It is certified that error appears in the above-identified patent and that said Letters Patent is hereby corrected as shown below:

In the drawings, delete Sheet 7 of 12, FIG. 10B, replace with the following:

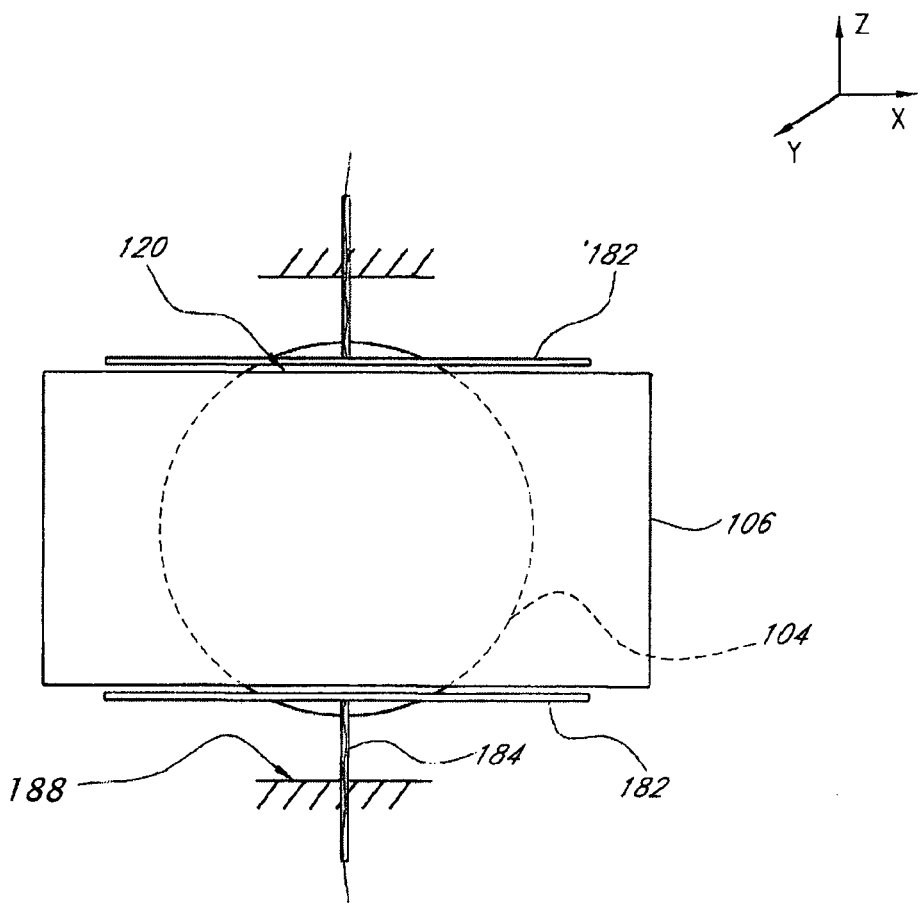

FIG. 10B

Signed and Sealed this
Twentieth Day of September, 2011

David J. Kappos
*Director of the United States Patent and Trademark Office*

CERTIFICATE OF CORRECTION (continued)
U.S. Pat. No. 7,211,174 B2

At Column 10, Line 27, delete "as," and insert --as--, therefor.

At Column 12, Line 8, in Claim 4, after "establishes" insert --electrical--.

At Column 12, Line 24, in Claim 4, after "edge" insert --surface--.